(12) United States Patent
Park et al.

(10) Patent No.: US 7,671,530 B2
(45) Date of Patent: Mar. 2, 2010

(54) ORGANIC ELECTROLUMINESCENCE DISPLAY DEVICE AND METHOD OF FABRICATING THE SAME

(75) Inventors: Jae Yong Park, Anyang-si (KR); Kwang Jo Hwang, Anyang-si (KR); Jong Woo Park, Daegu-si (KR); Hee Dong Choi, Seosan-si (KR); Sang Ho Yu, Seongnam-si (KR); Jin Hyoung Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 478 days.

(21) Appl. No.: 11/641,002

(22) Filed: Dec. 19, 2006

(65) Prior Publication Data

US 2007/0159076 A1    Jul. 12, 2007

(30) Foreign Application Priority Data

Dec. 26, 2005    (KR) ........................ 10-2005-129469

(51) Int. Cl.
*H01J 1/62* (2006.01)
(52) U.S. Cl. ........................ 313/503; 445/24; 315/169.4
(58) Field of Classification Search ......... 313/498–512; 315/169.1, 169.3, 169.4; 427/58, 64, 66, 427/532–535, 539; 428/690–691, 917; 438/26–29, 438/34, 82; 257/40, 72, 98–100, 642–643, 257/759; 445/24–25
See application file for complete search history.

(56) References Cited

U.S. PATENT DOCUMENTS

| | | | |
|---|---|---|---|
| 2002/0195961 A1* | 12/2002 | Barth et al. | 315/169.3 |
| 2004/0100203 A1* | 5/2004 | Kobayashi et al. | 315/169.3 |
| 2004/0129936 A1* | 7/2004 | Park et al. | 257/40 |
| 2004/0130545 A1* | 7/2004 | Ishizuka | 345/212 |
| 2004/0233140 A1* | 11/2004 | Jo | 345/76 |
| 2006/0012311 A1* | 1/2006 | Ogawa | 315/169.3 |

* cited by examiner

*Primary Examiner*—Peter J Macchiarolo
*Assistant Examiner*—Donald L Raleigh
(74) *Attorney, Agent, or Firm*—McKenna Long & Aldridge

(57) ABSTRACT

Provided are an organic electroluminescence display device and method of fabricating the same. An organic electroluminescence display device according to the present invention includes a first substrate; a plurality of data lines arranged in a first direction on the first substrate; a plurality of gate lines arranged in a second direction on the first substrate; a plurality of pixel regions defined by the gate lines and the data lines, wherein a first pixel line is defined as a line of the pixel regions arranged in the first direction and a second pixel line is defined as a line of the pixel regions arranged in the second direction; a thin film transistor in each pixel region; a plurality of first connecting lines electrically connecting the thin film transistors of the first pixel lines with each other; and a second connecting line electrically connecting the thin film transistor of at least one of the second pixel lines.

34 Claims, 20 Drawing Sheets

ORGANIC ELECTROLUMINESCENCE DISPLAY DEVICE AND METHOD OF FABRICATING THE SAME

This application claims the benefit of Korean Patent Application No. P2005-129469, filed on Dec. 26, 2006, which is hereby incorporated by reference for all purposes as if fully set forth herein.

BACKGROUND OF THE INVENTION

1. Field of the Invention

The present invention relates to a display device, and more particularly, to an organic electroluminescence display device with a high brightness and method for fabricating the same.

2. Discussion of the Related Art

Organic electroluminescence display devices are one type of self-emission display devices and do not require an additional backlight source, which is different from liquid crystal display (LCD) devices. Organic electroluminescence display devices have advantages of lightweight, a slim profile, a low voltage driving, a high light-emission efficiency, a wide viewing angle, a fast response time, etc. and are thus advantageous in realizing high quality moving pictures.

Organic electroluminescence display devices are generally fabricated by deposition and encapsulating processes and thus their fabrication process is simple compared with LCD devices or plasma display panels (PDP). Also, when an organic electroluminescence display device is driven by an active matrix driving method in which a thin film transistor (TFT) functions as a switching device in each pixel, a high definition and large-sized organic electroluminescence display device can be realized with a low power and high brightness.

An organic electroluminescence display device is generally formed by attaching a substrate having an array device and an organic light emitting diode (OLED) to an encapsulation substrate. Because the yield of the organic electroluminescence display device is determined by multiplying the yield of the array device and the yield of the OLED, the total process yield of the organic electroluminescence display device is greatly limited by an OLED fabrication process. For this reason, a dual panel type organic electroluminescence display device has been proposed in which the array device and the OLED are formed on different substrates.

FIGS. 1A and 1B are views of a dual panel type organic electroluminescence display device according to the related art. FIG. 1A is a circuit diagram of the organic electroluminescence display device, and FIG. 1B is a cross-sectional view of the organic electroluminescence display device.

Referring to FIGS. 1A and 1B, a plurality of gate lines 11 and data lines 21 are formed to cross each other on a substrate 10. The gate lines 11 and the data lines 21 define pixel regions P. Power lines 31 are formed parallel to the gate lines 11 and spaced from the gate lines 11 by a predetermined interval.

Each of the pixel regions P includes a switching TFT S-Tr connected with the gate lines 11 and the data lines 21, a driving TFT D-Tr connected with a drain electrode of the switching TFT S-Tr, a capacitor connected with a source electrode of the driving TFT D-Tr, and an OLED E electrically connected with a drain electrode 50b of the driving TFT D-Tr. The OLED E is formed on an upper substrate (not shown) spaced from the substrate 10 by a predetermined interval. The power line 31 electrically connects the source electrode 50a of the driving TFT D-Tr and is grounded to maintain a potential of the OLED E.

Because a gate insulating layer 30 is interposed between the power line 31 and the driving TFT D-Tr, an etching process is performed on the gate insulating layer 30 in order to electrically connect the power line 31 with the driving TFT D-Tr. However, a part of the power line 31 is also etched during the etching process, and thus the contact resistance between the driving TFT D-Tr and the power line 31 included in each pixel region increases, thereby generating a voltage drop in each pixel and degrading the brightness and uniformity of the organic electroluminescence display device. Also, because the power lines 31 are formed in the pixel regions, the effective area of the pixel region and the design area of the TFT are reduced.

SUMMARY OF THE INVENTION

Accordingly, the present invention is directed to an organic electroluminescence display device and method for fabricating the same that substantially obviates one or more problems due to limitations and disadvantages of the related art.

An advantage of the present invention is to provide an organic electroluminescence display device with a high brightness and method for fabricating the same.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescence display device includes: a first substrate; a plurality of data lines arranged in a first direction on the first substrate; a plurality of gate lines arranged in a second direction on the first substrate; a plurality of pixel regions defined by the gate lines and the data lines, wherein a first pixel line is defined as a line of the pixel regions arranged in the first direction and a second pixel line is defined as a line of the pixel regions arranged in the second direction; a thin film transistor in each pixel region; a plurality of first connecting lines electrically connecting the thin film transistors of the first pixel lines with each other; and a second connecting line electrically connecting the thin film transistor of at least one of the second pixel lines.

In another aspect of the present invention, an organic electroluminescence display device includes: a first substrate; a plurality of data lines arranged in a first direction on the first substrate; a plurality of gate lines arranged in a second direction on the first substrate; a plurality of pixel regions defined by the gate lines and the data lines, wherein a first pixel line is defined as a line of the pixel regions arranged in the first direction and a second pixel line is defined as a line of the pixel regions arranged in the second direction; a thin film transistor in each pixel region; a first connecting line electrically connecting the thin film transistors of at least one of the first pixel lines with each other; and a plurality of second connecting lines electrically connecting the thin film transistors of the second pixel lines.

In another aspect of the present invention, an organic electroluminescence display device includes: a first substrate; a plurality of data lines arranged in a first direction on the first substrate; a plurality of gate lines arranged in a second direction on the first substrate; a plurality of pixel regions defined by the gate lines and the data lines, wherein a first pixel line is defined as a line of the pixel regions arranged in the first direction and a second pixel line is defined as a line of the pixel regions arranged in the second direction; a thin film transistor in each pixel region; a plurality of first connecting lines electrically connecting the thin film transistors of the first pixel lines with each other; and a plurality of second connecting lines electrically connecting the thin film transistor of the second pixel lines.

In another aspect of the present invention, a method of fabricating an organic electroluminescence display device includes: preparing a first substrate; forming a plurality of gate lines and gate electrodes in a second direction on the first substrate; forming a gate insulating layer on the first substrate including the gate electrodes; forming an active layer on the gate insulating layer to correspond to the gate electrodes; forming a plurality of data lines, source/drain electrodes, and a plurality of first connecting lines in a second direction on the active layer, the gate electrodes, the active layer, and the source/drain electrodes constituting thin film transistors, the gate lines and the data lines defining a plurality of pixel regions, wherein a first pixel line is defined as a line of the pixel regions arranged in the first direction and a second pixel line is defined as a line of the pixel regions arranged in the second direction; forming a protective layer on the thin film transistors; and forming a second connecting line on the protective layer, wherein the first connecting lines electrically connect the thin film transistors of the first pixel lines with each other, and the second connecting line electrically connects the thin film transistors of at least one of the second pixel lines with each other.

In another aspect of the present invention, a method of fabricating an organic electroluminescence display device includes: preparing a first substrate; forming a plurality of gate lines and gate electrodes having a second direction on the first substrate; forming a gate insulating layer on the first substrate including the gate electrodes; forming an active layer on the gate insulating layer to corresponding the gate electrodes; forming a plurality of data lines, source/drain electrodes, and a first connecting line having a first direction on the active layer, the gate electrodes, the active layer, and the source/drain electrodes constituting thin film transistors, the gate lines and the data lines defining a plurality of pixel regions, wherein a first pixel line is defined as a line of the pixel regions arranged in the first direction and a second pixel line is defined as a line of the pixel regions arranged in the second direction; forming a protective layer on the thin film transistors; and forming a plurality of second connecting lines on the protective layer, wherein the first connecting line electrically connect the thin film transistors of at least one of the first pixel lines with each other, and the second connecting lines electrically connects the thin film transistors of the second pixel lines with each other.

In yet another aspect of the present invention, a method of fabricating an organic electroluminescence display device includes: preparing a first substrate; forming a plurality of gate lines and gate electrodes having a second direction on the first substrate; forming a gate insulating layer on the first substrate including the gate electrodes; forming an active layer on the gate insulating layer to corresponding the gate electrodes; forming a plurality of data lines, source/drain electrodes, and a plurality of first connecting lines having a first direction on the active layer, the gate electrodes, the active layer, and the source/drain electrodes constituting thin film transistors, the gate lines and the data lines defining a plurality of pixel regions, wherein a first pixel line is defined as a line of the pixel regions arranged in the first direction and a second pixel line is defined as a line of the pixel regions arranged in the second direction; forming a protective layer on the thin film transistors; and forming a plurality of second connecting lines on the protective layer, wherein the first connecting lines electrically connect the thin film transistors of the first pixel lines with each other, and the second connecting lines electrically connect the thin film transistors of the second pixel lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1A:
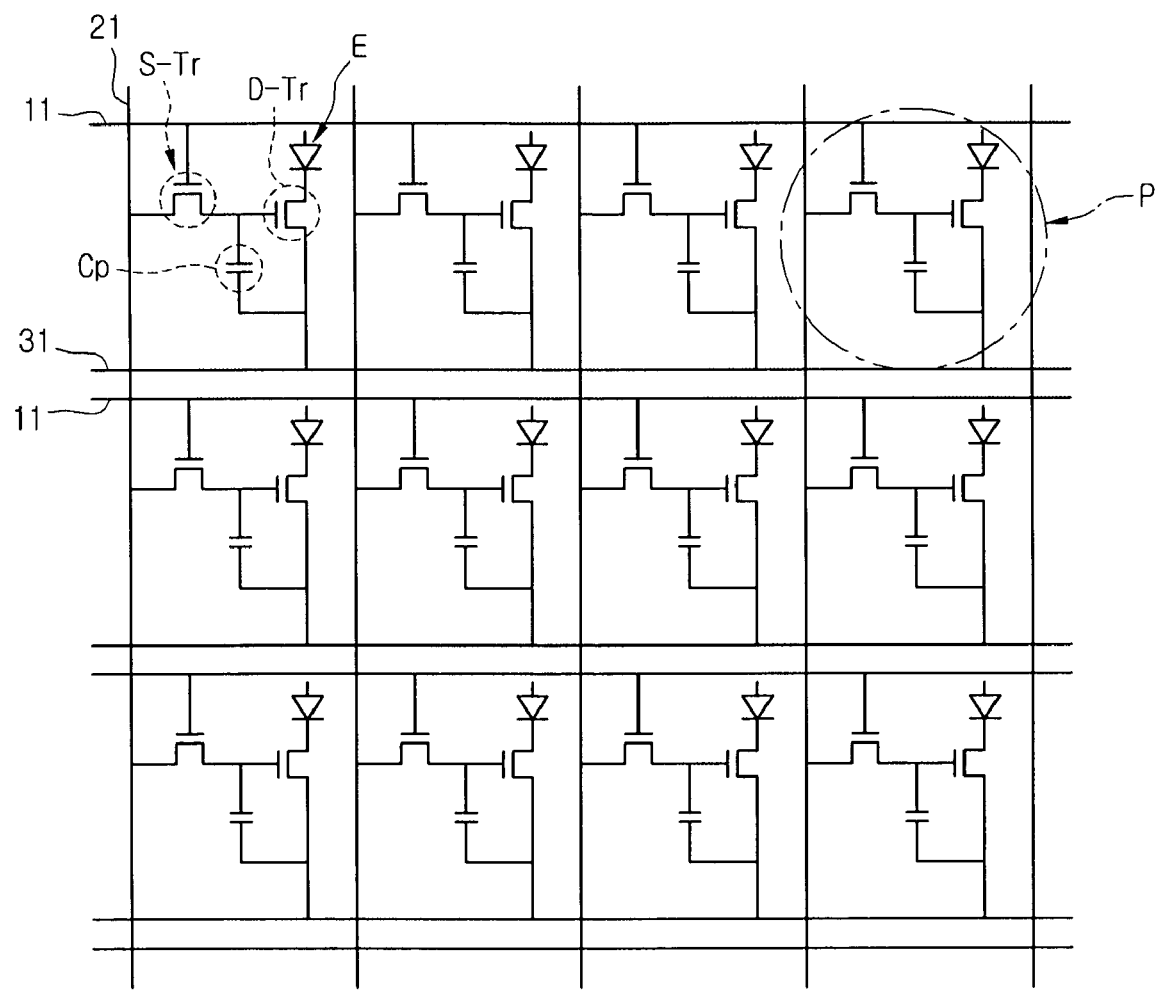
FIGS. 1A and 1B are views of a dual panel type organic electroluminescence display device according to the related art.
Figure 1B:
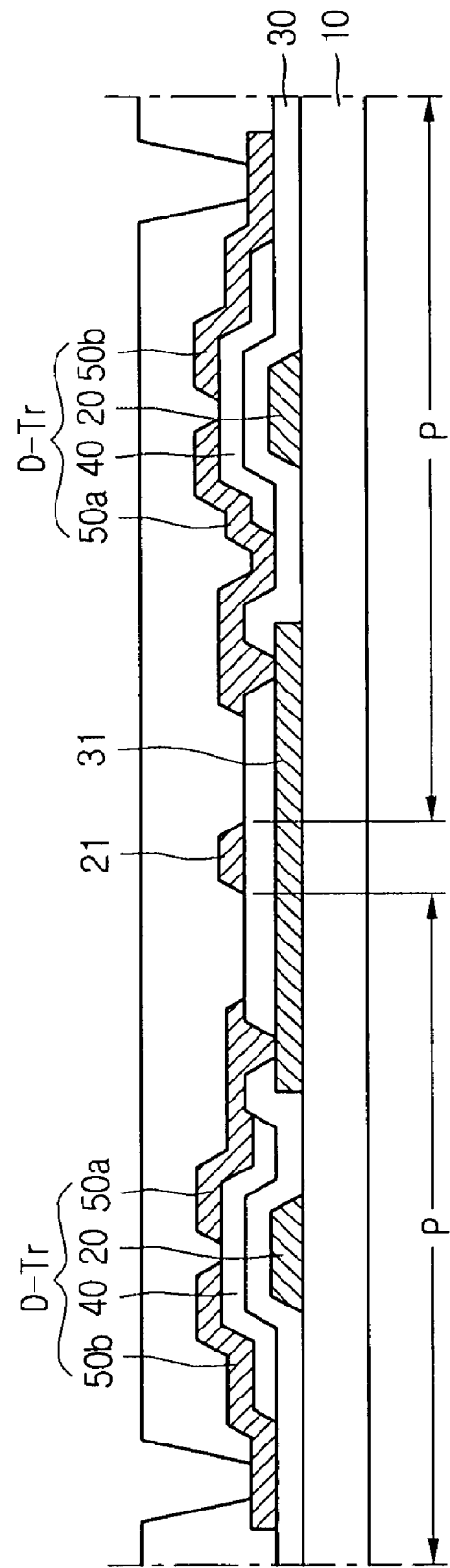
Figure 2A:
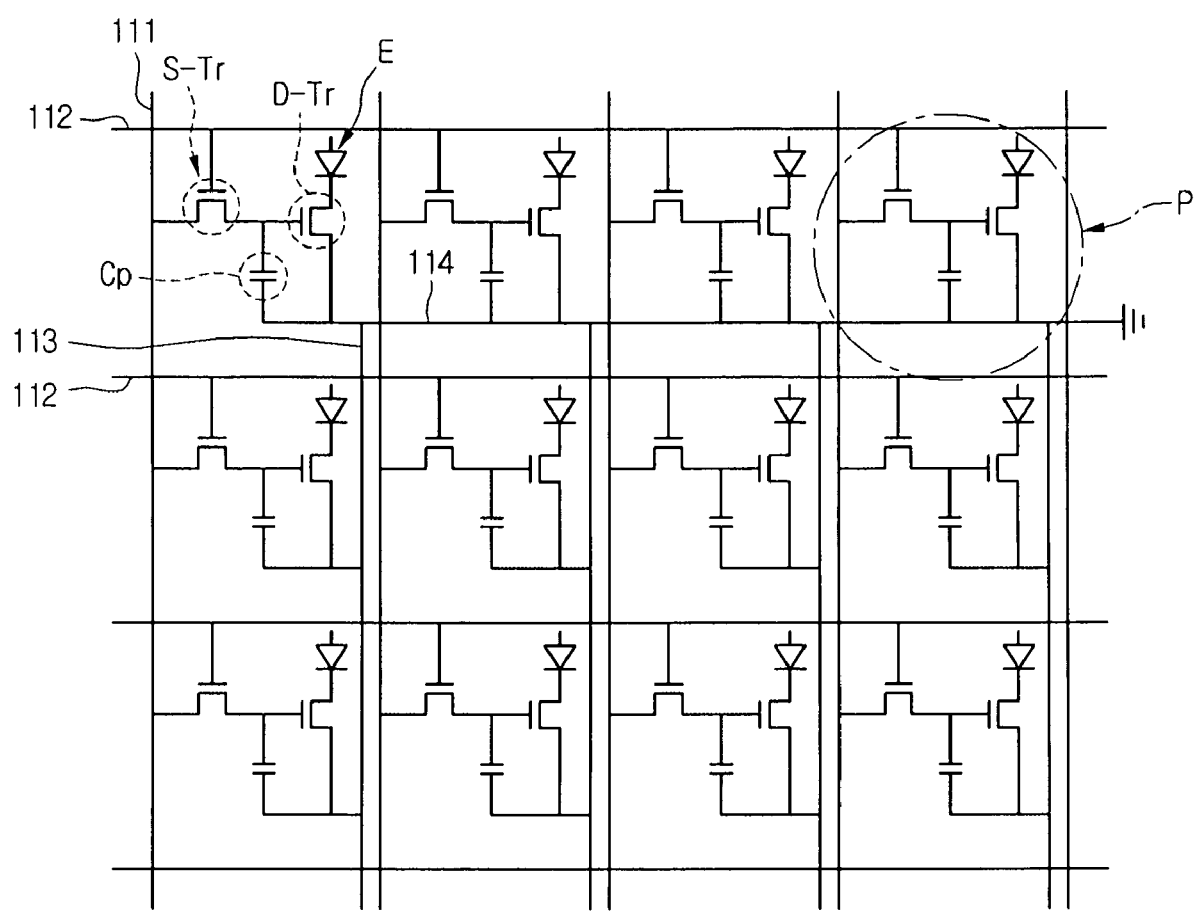
FIGS. 2A and 2B are views of an organic electroluminescence display device according to the first embodiment of the present invention.
Figure 2B:
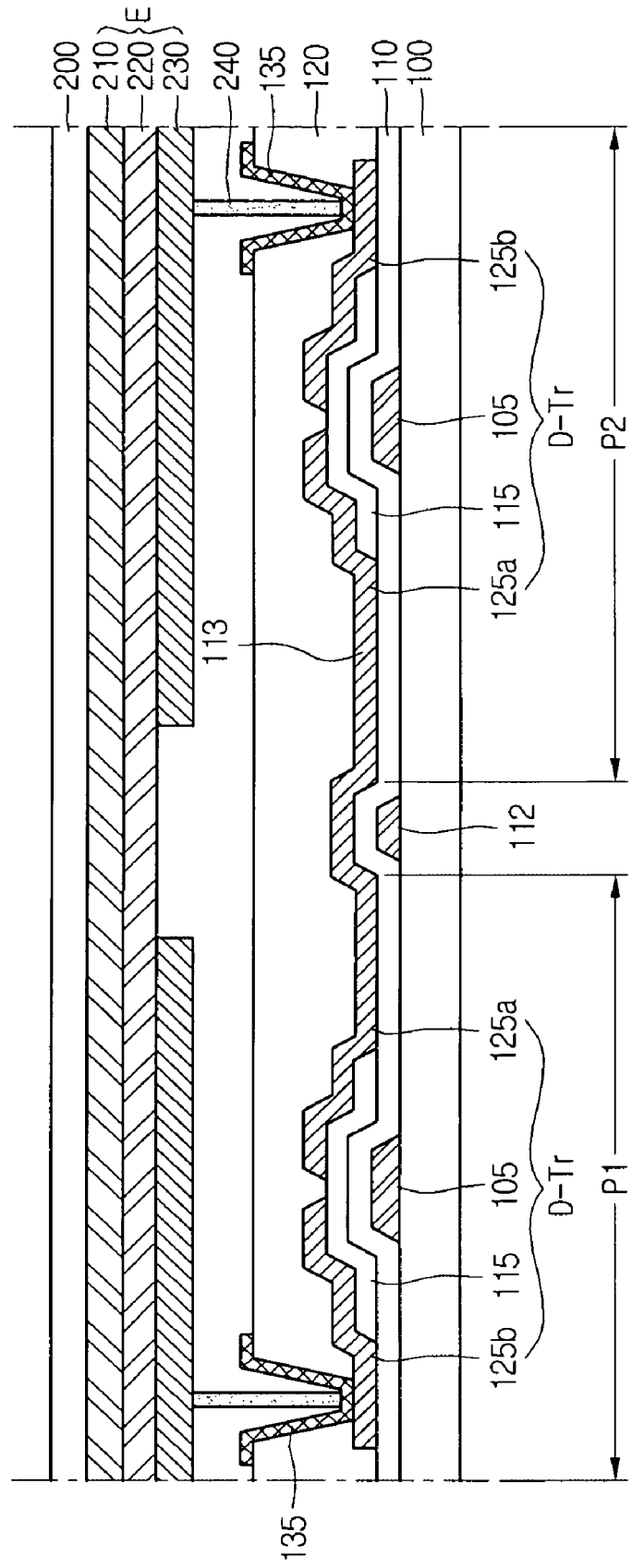

FIGS. 2A and 2B are views of an organic electroluminescence display device according to the first embodiment of the present invention. FIG. 2A is a circuit diagram of the organic electroluminescence display device.

Referring to FIG. 2A, the organic electroluminescence display device includes data lines 111 in a first direction and gate lines 112 in a second direction that cross each other. The data lines 111 and the gate lines 112 define pixel regions P. A first pixel line is defined as a column of pixel regions arranged in the first direction and a second pixel line is defined as a row of pixel regions arranged in the second direction, as illustrated in FIG. 2A.

Each of the pixel regions P includes a switching TFT S-Tr connected with the data line 111 and the gate line 112. That is, the switching TFT S-Tr includes a source electrode connected to the data line 111 and a gate electrode connected with the gate line 112.

The switching TFT S-Tr also includes a drain electrode connected with a driving TFT D-Tr and a capacitor Cp. That is, the driving TFT D-Tr includes a gate electrode connected with the drain electrode of the switching TFT S-Tr and a source electrode connected with the capacitor Cp. The driving TFT D-Tr also includes a drain electrode electrically connected with an organic light-emitting diode (OLED) E.

The source electrodes of the driving TFTs D-Tr included in each of the plurality of first pixel lines are electrically connected with each other through a first connecting line 113. Also, the source electrodes of the driving TFTs D-Tr included in one of the plurality of second pixel lines are electrically connected with each other through a second connecting line 114. The second connecting line 114 is grounded to maintain a potential of the OLED E. Also, the second connecting line 114 is electrically connected with the plurality of first connecting lines 113. Therefore, the second connecting line 114 is connected with only one of the plurality of second pixel lines, thereby increasing an effective area in the pixel region. It should be understood that although only one second connecting line 114 is used to connect one of the plurality of second pixel lines in FIG. 2A, more than one second connecting line may be used to connect more than one second pixel line without deviating from the principles of the present invention.

FIG. 2B is a cross-sectional view of the organic electroluminescence display device and illustrates the two adjacent pixel regions arranged in the first direction of FIG. 2A, for convenience of description, FIG. 2B only illustrates the driving TFTs D-Tr.

Referring to FIG. 2B, the organic electroluminescence display device includes a first substrate 100 and a second substrate 200 spaced from each other by a predetermined interval. The first substrate 100 includes an array device having driving TFTs D-Tr and the second substrate 200 includes an OLED E. The driving TFT D-Tr is electrically connected with the OLED E through a spacer 240.

In detail, gate electrodes 105 and the gate line 112 are formed on the first substrate 100. The gate line 112 defines a first pixel region P1 and a second pixel region P2, with both the first and second pixel regions P1 and P2 being in the first pixel line.

A gate insulating layer 110 is formed on the first substrate 100 including the gate electrodes 105. The gate insulating layer 110 may be a silicon oxide layer, a silicon nitride layer, or a stacked layer of the aforementioned layers.

Active layers 115 are formed on the gate insulating layer 110 to correspond to the gate electrodes 105. The active layers 115 may include a channel layer formed of an amorphous silicon layer and an ohmic contact layer formed of an amorphous silicon layer doped with impurities.

A source electrode 125a and a drain electrode 125b are formed on each active layer 115 and spaced from each other by a predetermined distance. The source electrodes of the driving TFTs D-Tr included in the first and second pixel regions P1 and P2 are electrically connected with each other through a first connecting line 113. The first connecting line 113 may be formed parallel to the data line (not shown) crossing the gate line 112. The first connecting line 113 extends from the source electrodes 125a.

Because an etching process for connecting the first connecting line 113 with the source electrode 125a is not needed, a voltage drop caused by a partial etching of a power line can be prevented. Accordingly, the non-uniformity in brightness in the related art can be minimized or prevented.

Also, because the organic electroluminescence display device does not include a power line of the related art, an effective area of the pixel region is increased. Therefore, a design area for the TFT in the pixel region can be enlarged.

For example, a design area for the source and drain electrodes 125a and 125b of each TFT can be enlarged, thereby increasing an amount of current supplied to the OLED. This is because an amount of current supplied to the OLED is proportional to a width W of a channel area between the source and drain electrodes 125a and 125b. Therefore, the whole brightness of the organic electroluminescence display device can be improved. Moreover, with the increased effective area, a size of the capacitor Cp can be increased by, for example, increasing areas of the gate electrode 105 and the source electrode 125a.

The driving TFTs D-Tr electrically connected with each other through the first connecting line 113 are now formed on the first substrate 100.

A protective layer 120 is formed on the gate insulating layer 110 including the driving TFTs D-Tr. The protective layer 120 may be formed of an organic layer, an inorganic layer, a stacked layer of the aforementioned layers, or the like. The organic layer may include a polyamide resin, a polyimide resin, an acryl resin, a silicon-based resin, or the like. The inorganic layer may be a silicon oxide layer, a silicon nitride layer, a stacked layer of the aforementioned layers, or the like.

The protective layer 120 includes a contact hole exposing the drain electrode 125b. The drain electrode 125b of the driving TFT D-Tr is electrically connected with a contact electrode 135 of the OLED E through the contact hole.

Although now shown, a second connecting line is formed to electrically connect the source electrodes of the driving TFTs D-Tr included in the pixel regions P of one of the second pixel lines with each other. The second connecting line is formed parallel to the gate line 112 and is grounded. The second connecting line is formed on the protective layer 120 and may be formed of the same material as that of the contact electrode 135 to simplify the fabricating process. Because the second connecting line is formed on the protective layer 120, it does not affect a design area for forming the TFTs.

Meanwhile, the OLED E including a first electrode 210, an organic layer 220 including at least an organic light-emitting layer, and a second electrode 230 is formed on the second substrate 200.

The first electrode 210 is a transparent electrode including ITO, IZO, or the like. On the other hand, the second electrode 230 is an opaque metal electrode including Mg, Ca, Al, Ag, Ba, an alloy of the aforementioned elements, or the like.

The organic layer 220 may further include a hole injection layer, a hole transport layer, a hole blocking layer, an electron transport layer, and an electron injection layer. Therefore, electrons and holes can be efficiently injected into the organic light-emitting layer and the luminous efficiency of the completed organic luminescence display device can be improved.

An auxiliary electrode (not shown) electrically connected with the first electrode 210 may be further formed on the second substrate 200. Because the first electrode 210 is formed of a conductive transparent material having a relatively high resistance, the auxiliary electrode is used to reduce a resistance difference, and thus can minimize or prevent the non-uniformity in brightness.

The spacer 240 interposed between the first and second substrates 100 and 200 electrically connects the driving TFTs D-Tr with the OLED E to complete the organic electroluminescence display device.

FIGS. 3A to 3D are views illustrating a method of fabricating an organic electroluminescence display device according to the first embodiment of the present invention.

Figure 3A:
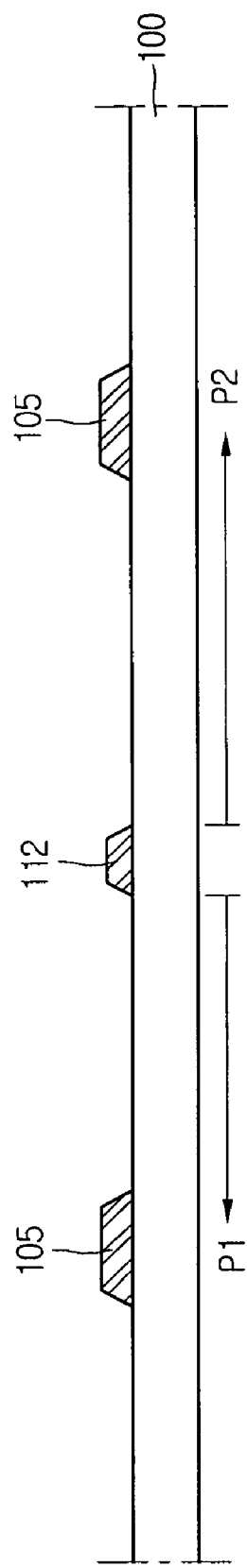
FIGS. 3A to 3D are views illustrating a method of fabricating an organic electroluminescence display device according to the first embodiment of the present invention.

Referring to FIG. 3A, a conductive material is deposited on a first substrate 100 and patterned to form gate electrodes 105 and a gate line 112 in the second direction. The gate line 112 may define first and second pixel regions P1 and P2.

Figure 3B:
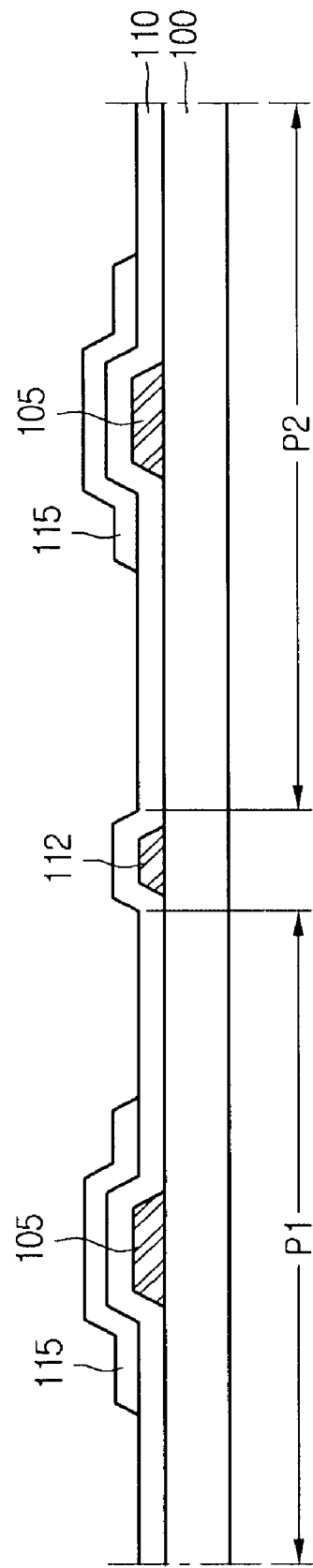

Referring to FIG. 3B, a gate insulating layer 110 is formed on the first substrate 100 including the gate electrodes 105.

An amorphous silicon layer and an amorphous silicon layer doped with impurities are sequentially formed on the gate insulating layer 110 and patterned to form active layers 115.

Figure 3C:
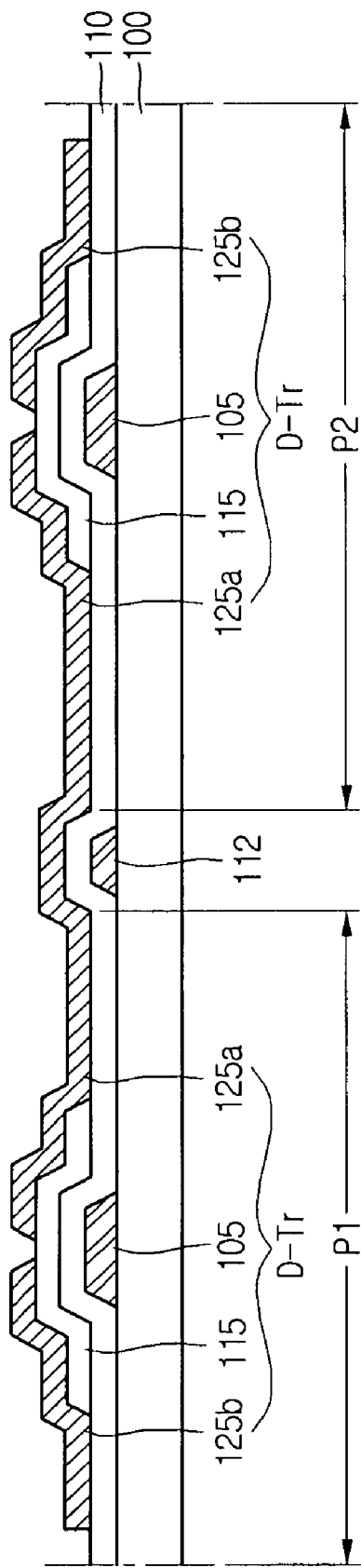

Referring to FIG. 3C, a conductive material is deposited on the gate insulating layer 110 including the active layers 115 and patterned to form a data line (not shown) in the first direction, a source electrode 125a and a drain electrode 125b spaced from each other by a predetermined distance on the active layer 115. A first connecting line 113, which extends from the source electrodes 125a included in the pixel regions of each of the first pixel line, are also formed. As a result, driving TFTs D-Tr connected with each other through the first connecting lines 113 are formed on the first substrate 100.

Figure 3D:
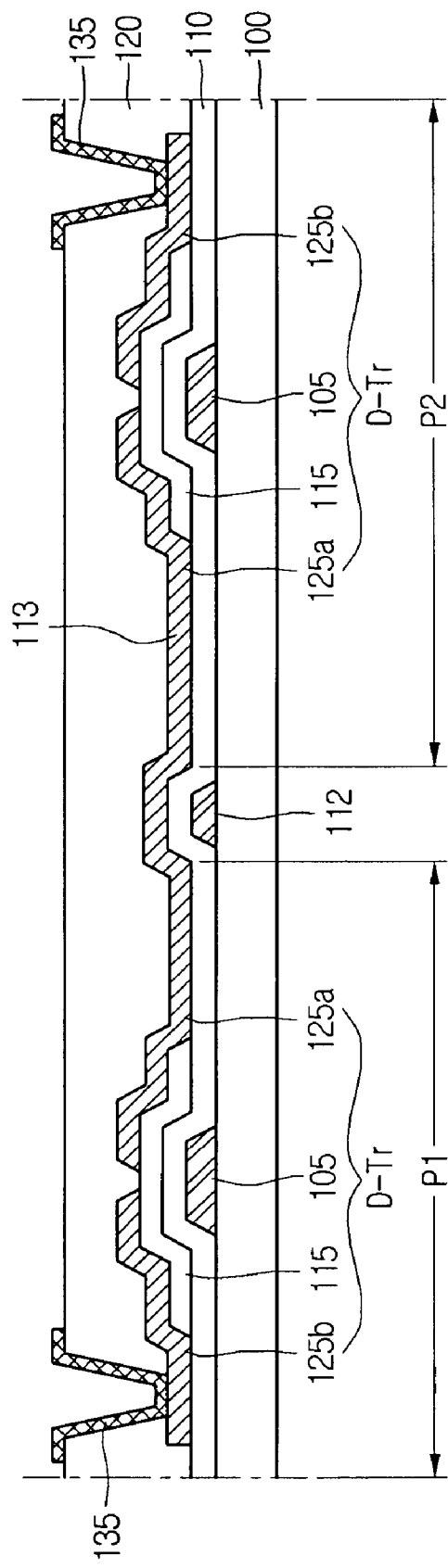

Referring to FIG. 3D, a protective layer 120 is formed on the gate insulating layer 120 including the driving TFTs D-Tr. The protective layer 120 is patterned to form contact holes exposing parts of the drain electrodes 125b. The contact holes are used to electrically connect the drain electrodes 125b with the OLED E.

A conductive material may be deposited on the protective layer 120 including the contact holes and patterned to form contact electrodes 135 electrically connected with the drain electrodes 125b through the contact holes.

A second connecting line (not shown) is simultaneously formed with the contact electrodes 135. The second connecting line connects the source electrodes 125a of the drive TFTs-Tr included in the pixel regions of one of the second pixel lines.

A second substrate 200 including an OLED E is then attached to the first substrate 100 to complete the organic electroluminescence display device.

Figure 4A:
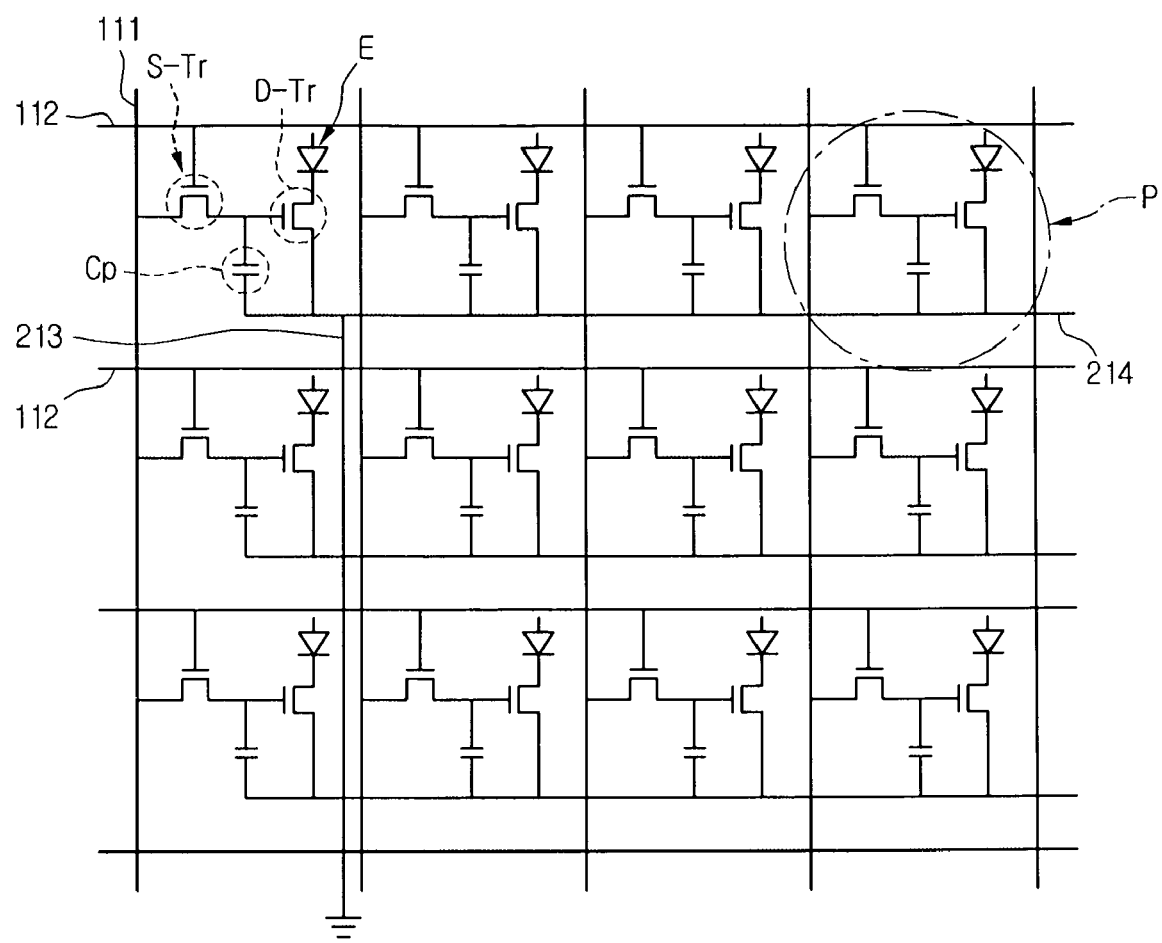
FIGS. 4A and 4B are views of an organic electroluminescence display device according to the second embodiment of the present invention.
Figure 4B:
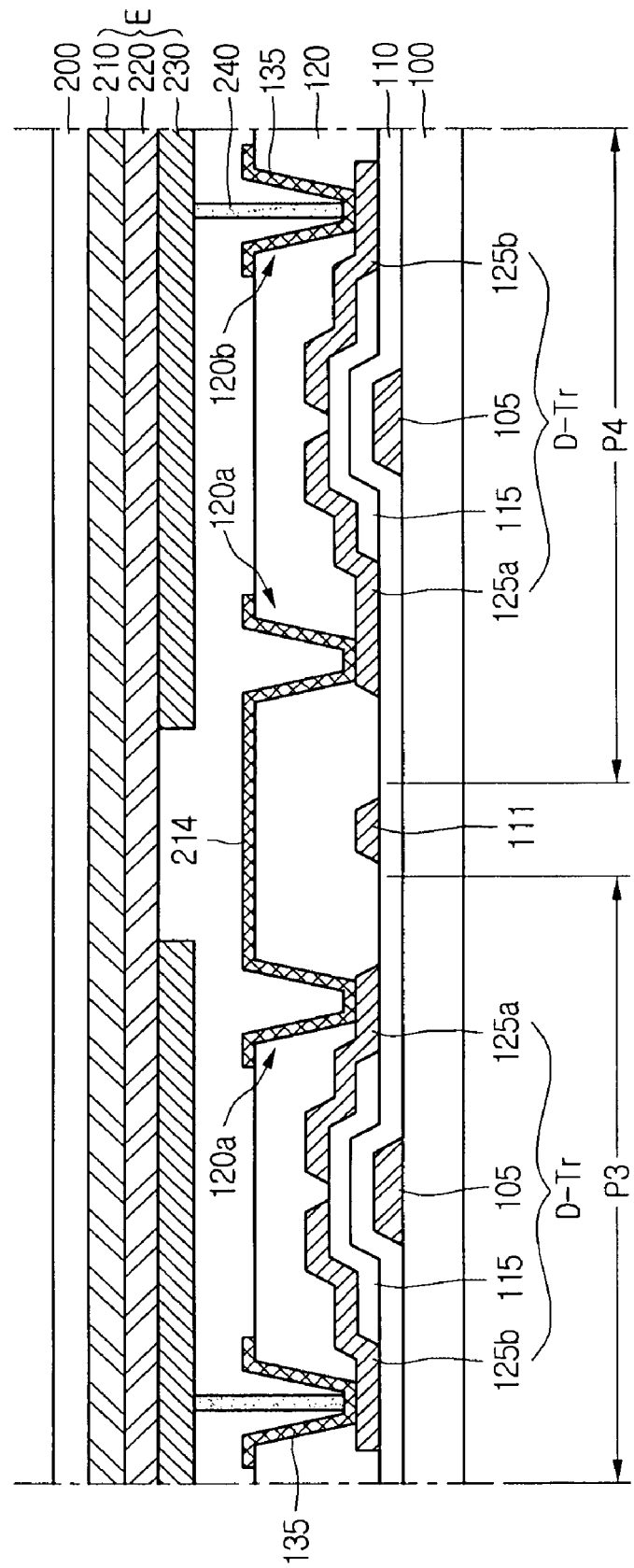

FIGS. 4A and 4B are views of an organic electroluminescence display device according to the second embodiment of the present invention. The second embodiment of the present invention is the same as the first embodiment except for a method of connecting the first and second connecting lines with each other, and thus this will be mainly described. Accordingly, the same reference numerals represent the same elements and repeated descriptions will be omitted.

Referring to FIG. 4A, the organic electroluminescence display device includes gate lines 111 in a first direction and data lines 112 in a second direction that cross each other. The data lines 111 and the gate lines 112 define pixel regions P. A first pixel line is defined as a column of pixel regions arranged in the first direction and a second pixel line is defined as a row of pixel regions arranged in the second direction, as illustrated in FIG. 4A.

Each of the pixel regions P includes a switching TFT S-Tr, a driving TFT D-Tr, a capacitor Cp, and an OLED E.

The source electrodes of the driving TFTs D-Tr included in each of the second pixel lines are electrically connected with each other through a second connecting line 214. Also, the source electrodes of the driving TFTs D-Tr included in one of the first pixel lines are electrically connected with each other through a first connecting line 213. The first connecting line 213 is grounded to maintain a potential of the OLED E. Also, the first connecting line 213 is electrically connected with the plurality of second connecting lines 214. Therefore, the first connecting line 213 is connected with only one of the plurality of first pixel lines, thereby increasing an effective area of the pixel region. It should be understood that although only one first connecting line 213 is used to connect one of the plurality of first pixel lines in FIG. 4A, more than one first connecting line may be used to connect more than one first pixel line without deviating from the principles of the present invention.

FIG. 4B is a cross-sectional view of the organic electroluminescence display device and illustrates the two adjacent pixel regions arranged in the second direction of FIG. 4A. For convenience of description, FIG. 4B only illustrates the driving TFTs D-Tr.

Referring to FIG. 4B, the organic electroluminescence display device includes a first substrate 100 and a second substrate 200 spaced from each other by a predetermined interval. The first substrate 100 includes an array device having a driving TFT D-Tr and the second substrate 200 includes an OLED E. The driving TFT D-Tr is electrically connected with the OLED E through a spacer 240.

In detail, gate electrodes 105 are formed on the first substrate 100 and a gate insulating layer 110 is formed on the gate electrodes 105.

The data line 111 is formed on the gate insulating layer 110 to define first and second pixel regions P3 and P4.

Active layers 115 are formed on the gate insulating layer 110 to correspond to the gate electrodes 105. Source and drain electrodes 125a and 125b are spaced from each other by a predetermined distance on each of the active layers 115. As a result, the driving TFTs D-Tr are included in the first and second pixel regions P3 and P4.

A protective layer 120 is formed on the gate insulating layer 110 including the driving TFTs D-Tr. The protective layer 120 includes first contact holes 120a exposing source electrodes 125a.

A second connecting line 214 is formed on the protective layer 120 to connect the source electrodes 125a exposed through the first contact holes 120a with each other. The second connecting line 214 connects the source electrodes 125a of the driving TFTs D-Tr included the pixel regions in one of the second pixel lines with each other.

As a result, because the source electrodes 125a of the adjacent driving TFTs D-Tr are electrically connected with each other without forming a power line of the related art on the first substrate 100, an effective area of the pixel region P can be increased. Also, because the second connecting line 214 serving as a power line of the related art are formed on the protective line 120, a design area for the TFT and a brightness of the organic electroluminescence display device are increased. Moreover, with the increased effective area, a size of the capacitor Cp can be increased by, for example, increasing areas of the gate electrode 105 and the source electrode 125a.

The protective layer 120 may further include second contact holes 120b exposing parts of drain electrodes 125b in order to electrically connect the drain electrodes 125b with the OLED E.

Also, contact electrodes 135 may be formed on the drain electrodes 125b exposed by the second contact holes 120b. The second connecting lines 214 and the contact electrodes 135 may be formed of the same material to simplify the fabrication process.

Although not shown, a first connecting line is formed to electrically connect the source electrodes of the driving TFTs D-Tr included in the pixel regions P of one of the first pixel lines.

Meanwhile, the OLED E is formed on the second substrate 200, and the spacer 240 interposed between the first and second substrates 100 and 200 electrically connects the OLED E with the driving TFTs D-Tr.

FIGS. 5A to 5D are views illustrating a method of fabricating an organic electroluminescence display device according to the second embodiment of the present invention.

Figure 5A:
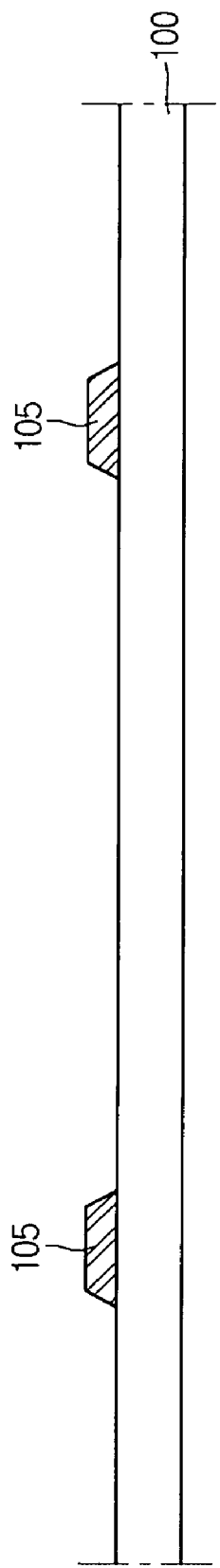
FIGS. 5A to 5D are views illustrating a method of fabricating an organic electroluminescence display device according to the second embodiment of the present invention.

Referring to FIG. 5A, a conductive material is deposited on a first substrate 100 and patterned to form a gate line (not shown) and gate electrodes 105 in the second direction.

Figure 5B:
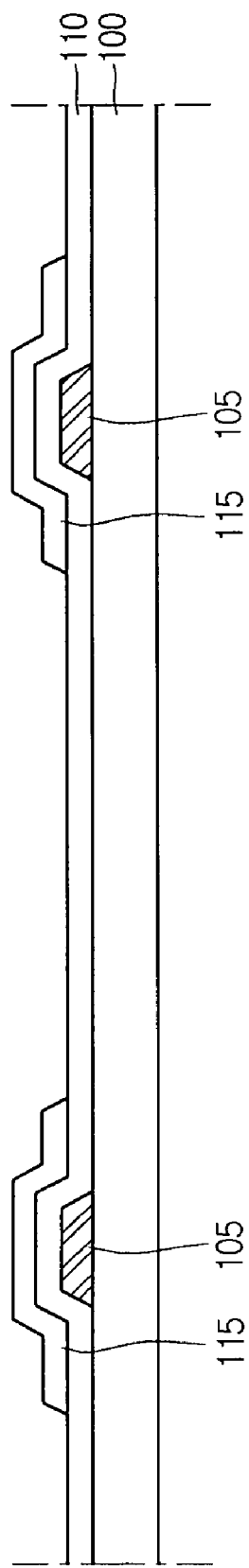

Referring to FIG. 5B, a gate insulating layer 110 is formed on the first substrate 100 including the gate electrodes 105.

An amorphous silicon layer and an amorphous silicon layer doped with impurities are sequentially formed on the gate insulating layer 110 and patterned to form active layers 115.

Figure 5C:
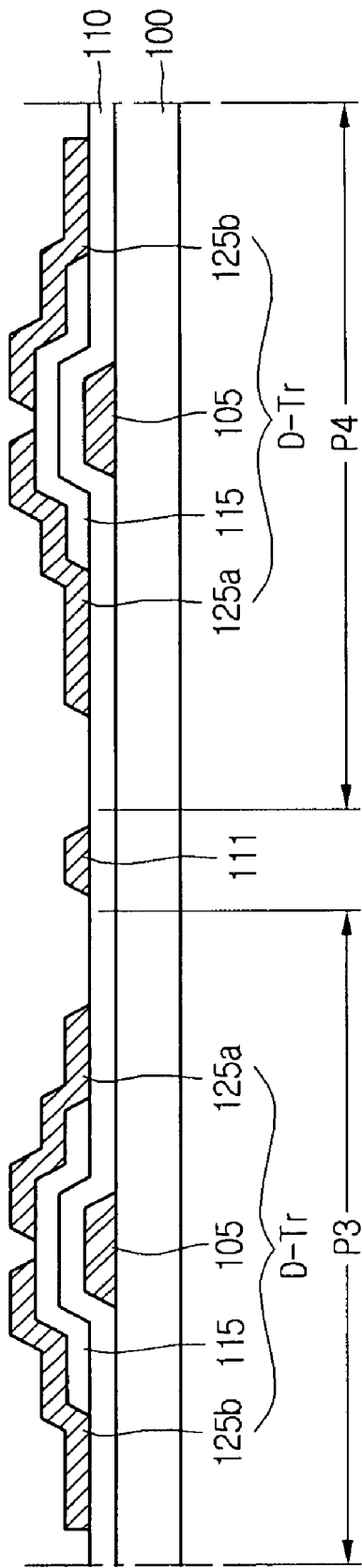

Referring to FIG. 5C, a conductive material is deposited on the gate insulating layer 110 including the active layers 115 and patterned to simultaneously form a source electrode 125a and a drain electrode 125b at both end portions of the active layer 115 and a data line 111 in the first direction. The data line 111 defines first and second pixel regions P3 and P4.

Also, a first connecting line (not shown) is formed to connect the source electrodes 125a of driving TFTs D-Tr included in the pixel regions of one of the first pixel lines.

Figure 5D:
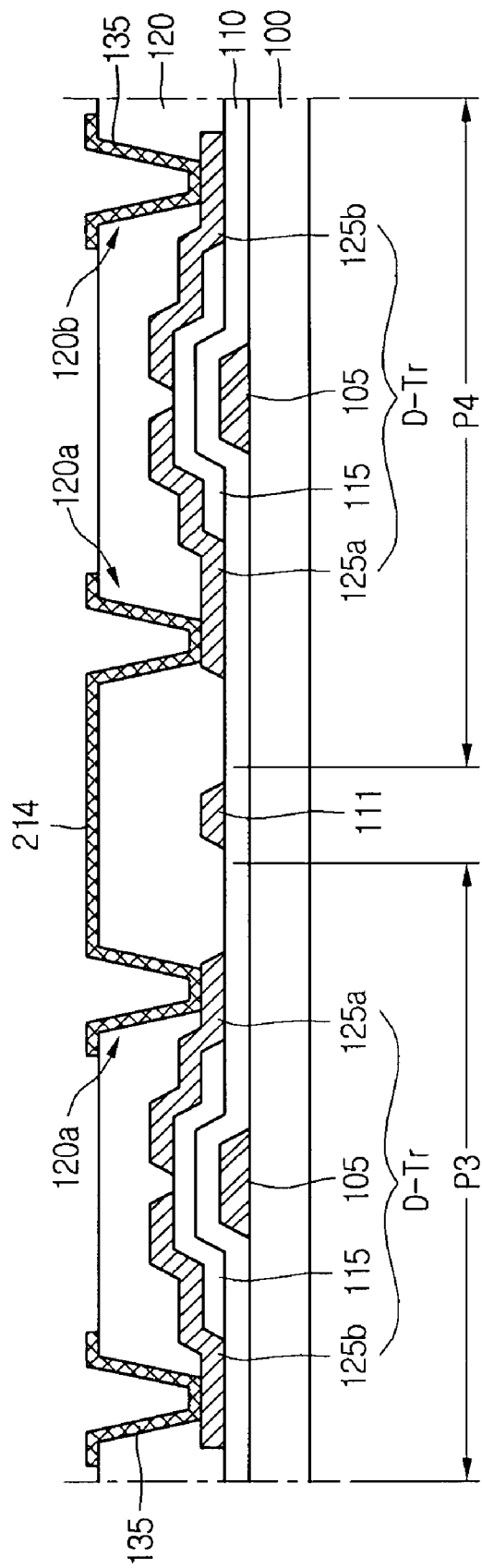

Referring to FIG. 5D, a protective layer 120 is formed on the gate insulating layer 120 including the driving TFTs D-Tr. The protective layer 120 is patterned to form first and second contact holes 120a and 120b respectively exposing parts of the source electrode 125a and the drain electrode 125b.

A conductive material is deposited on the protective layer 120 including the first and second contact holes 120a and 120b and patterned to form second connecting lines 214 connecting the source electrodes 125a of the driving TFTs D-Tr included in the adjacent pixel regions with each other through the first contact holes 120a. The second connecting lines 214 are electrically connected with the source electrodes 125a of the driving TFTs D-Tr included in the pixel regions of the second pixel lines. Simultaneously, contact electrodes 135 electrically connected to the exposed drain electrodes through second contact holes 120b may be formed.

A second substrate 200 including an OLED E may then be attached to the first substrate 100 to complete the organic electroluminescence display device.

Figure 6A:
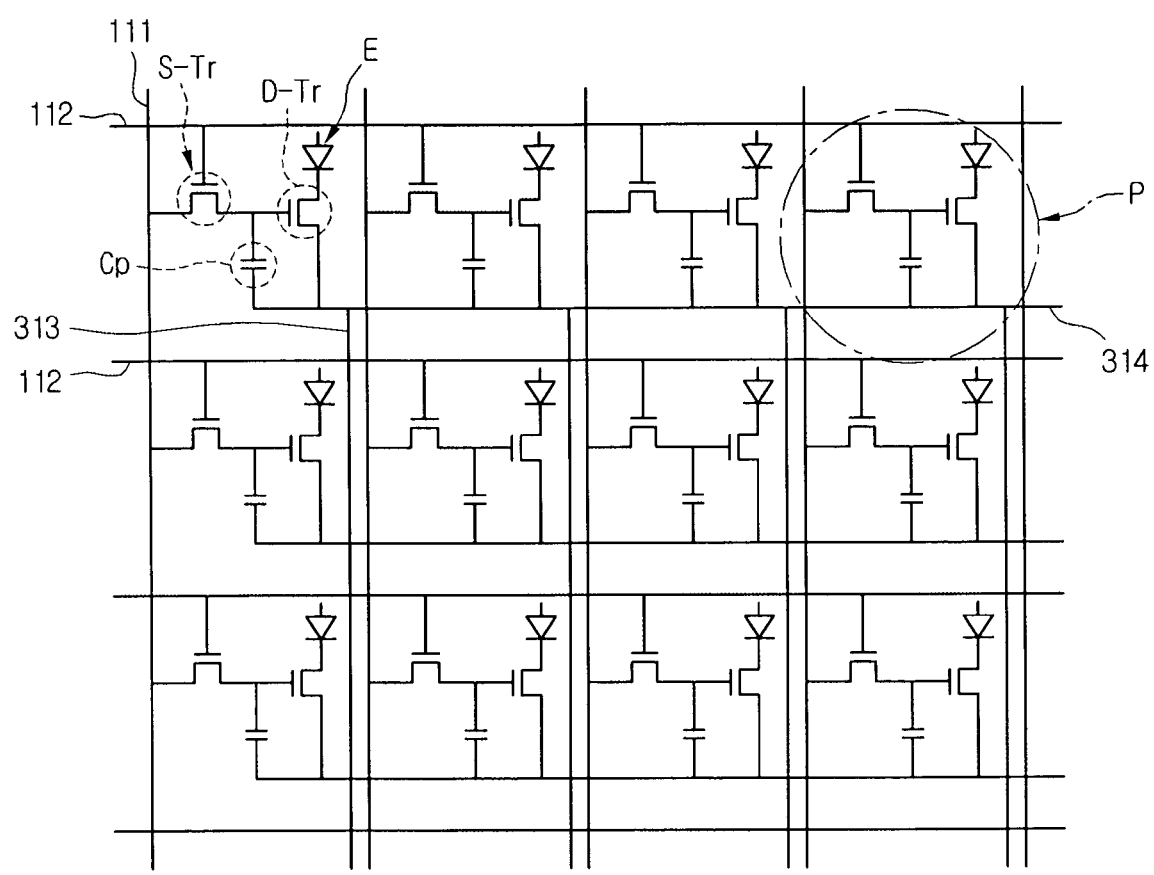
FIGS. 6A and 6B are views of an organic electroluminescence display device according to the third embodiment of the present invention.
Figure 6B:
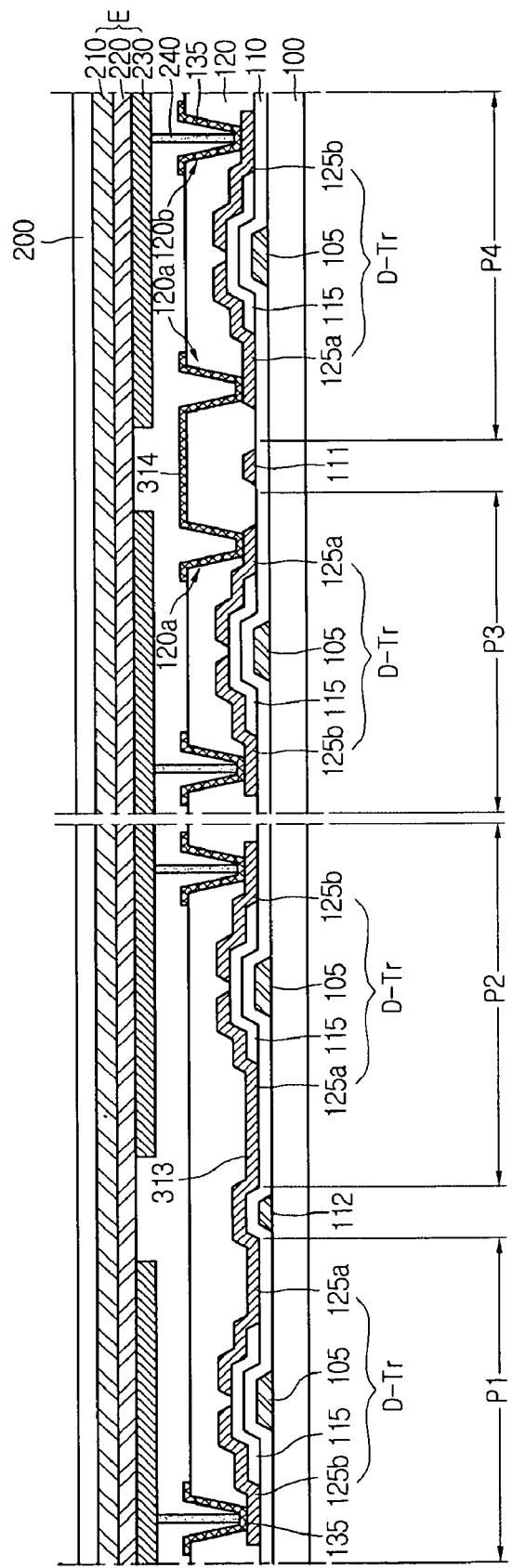

FIGS. 6A and 6B are views of an organic electroluminescence display device according to the third embodiment of the present invention. The third embodiment of the present invention is the same as the first embodiment except for the first and second connecting lines. Therefore, the same reference numbers will represent the same elements and repeated descriptions will be omitted.

Referring to FIG. 6A, the organic electroluminescence display device includes gate lines 111 in a first direction and data lines 112 in a second direction that cross each other. The data lines 111 and the gate lines 112 define pixel regions P. A first pixel line is defined as a column of pixel regions arranged in the first direction and a second pixel line is defined as a row of pixel regions arranged in the second direction, as illustrated in FIG. 6A.

Each of the pixel regions P includes a switching TFT S-Tr, a driving TFT D-Tr, a capacitor Cp, and an OLED E.

The source electrodes of the driving TFTs D-Tr included in each of the first pixel lines are electrically connected with each other through a first connecting line 313. Also, the source electrodes of the driving TFTs D-Tr included in each of the second pixel lines are electrically connected with each other through a second connecting line 314. The first connecting lines 314 are electrically connected with the second connecting lines 314. At least one kind of lines of the first and second connecting lines 313 and 314 is grounded to maintain a potential of the OLED E. Therefore, because a power line of the related art is not used in the pixel regions, the non-uniformity in brightness in the related art can be minimized or prevented and an effective area of the pixel region can be increased.

FIG. 6B is a cross-sectional view of the organic electroluminescence display device and illustrates the two adjacent pixel regions arranged in the first direction and the two adjacent pixel regions arranged in the second direction of FIG. 6A. For convenience of description, FIG. 6B definitely only illustrates the driving TFTs D-Tr.

Referring to FIG. 6B, the organic electroluminescence display device includes a first substrate 100 and a second substrate 200 spaced from each other by a predetermined interval. The first substrate 100 includes an array device having a driving TFT D-Tr and the second substrate 200 includes an OLED E. The driving TFT D-Tr is electrically connected with the OLED E through a spacer 240.

In detail, gate electrodes 105 and a gate line 112 are formed in the second direction on the first substrate 100. The gate line 112 defines a first pixel region P1 and a second pixel region P2 arranged in the first direction.

A gate insulating layer 110 is formed on the first substrate 100 including the gate electrodes 105.

The data line 111 is formed on the gate insulating layer 110 which defines a third pixel region P3 and a fourth pixel region P4 arranged in the second direction.

Active layers 115 are formed on the gate insulating layer 110 to correspond to the gate electrodes 105 and a source electrode 125a and a drain electrode 125b are spaced from each other on each of the active layers 115.

The source electrodes 125a formed in the first and second pixel regions P1 and P2 are connected with each other through a first connecting line 313.

A protective layer 120 is formed on the gate insulating layer 110 including the drivers TFTs D-Tr. The protective layer 120 includes first contact holes 120a exposing the source electrodes 125a of the driving TFTs D-Tr included in the third and fourth pixel regions P3 and P4.

The second connecting line 314 is formed on the protective layer 120 to connect the source electrodes 125a exposed through the first contact holes 120a with each other. That is, the second connecting line 314 connects the source electrodes 125a of the driving TFTs D-Tr included in the pixel regions of each of the second pixel lines with each other.

As a result, the source electrodes 125a of the driving TFTs D-Tr included in the pixel regions arranged in the first direction are connected with each other through the first connecting lines 313 extending from the source electrodes 125a. Also, the source electrodes 125a of the driving TFTs D-Tr included in the pixel regions arranged in the second direction are connected with each other through the second connecting lines 314 formed on the protective layer 120 including the first contact holes 120a. That is, the source electrodes 125a of the driving TFTs D-Tr are electrically connected with each other through the first and second connecting lines 314 and 314 in a mesh shape. Accordingly, a plurality of power lines of the related art are not formed on the first substrate, and the source electrodes 125a of the driving TFTs D-Tr are connected with each other and grounded to maintain a potential of the OLED E.

With the configuration disclosed above, an effective area in the pixel region can be increased. Also, because the second connecting lines 314 are formed on the protective layer 120, a design area of the TFT and a brightness of the organic electroluminescence display device are increased. Moreover, with the increased design margin, a size of the capacitor Cp can be increased by, for example, increasing areas of the gate electrode 105 and the source electrode 125a.

The protective layer 120 may further include a second contact hole 120b exposing a part of the drain electrode 125b to electrically connect the drain electrode 125b with the OLED E.

Also, a contact electrode 135 may be further formed on the drain electrode 125b exposed through the second contact hole 120b. The second connecting lines 314 and the contact electrode 135 may be formed of the same material to simplify the fabrication process.

Meanwhile, the OLED E is formed on the second substrate 200 and a connecting electrode 240 is interposed between the first and second substrates 100 and 200 to electrically connect the OLED E with the driving TFT D-Tr.

FIGS. 7A to 7D are views illustrating a method of fabricating an organic electroluminescence display device according to the third embodiment of the present invention.

Figure 7A:
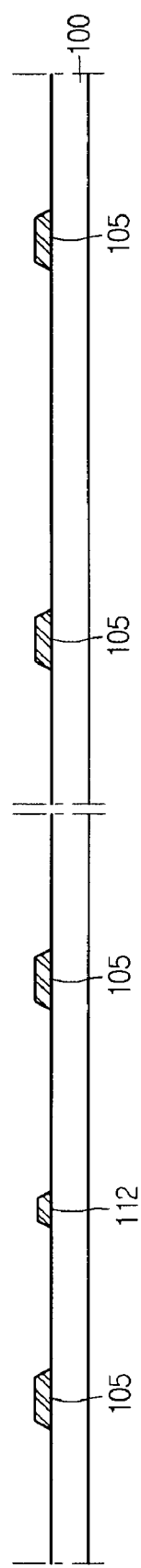
FIGS. 7A to 7D are views illustrating a method of fabricating an organic electroluminescence display device according to the third embodiment of the present invention.

Referring to FIG. 7A, a conductive material is deposited on a first substrate 100 and patterned to form a gate line 112 and gate electrodes 105 in the second direction. The gate line 112 may define a first pixel region P1 and a second pixel region P2.

Figure 7B:
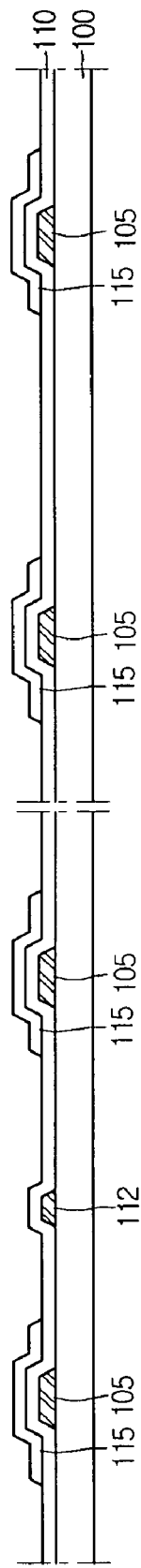

Referring to FIG. 7B, a gate insulating layer 110 is formed on the first substrate 100 including the gate electrodes 105.

An amorphous silicon layer and an amorphous silicon layer doped with impurities are sequentially formed on the gate insulating layer 110 and patterned to form active layers 115.

Figure 7C:
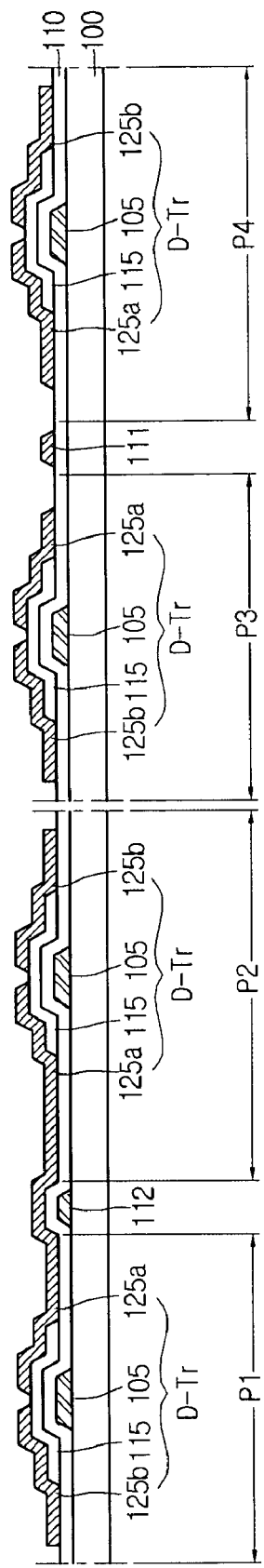

Referring to FIG. 7C, a conductive material is deposited on the gate insulating layer 110 including the active layers 115 and patterned to form source and drain electrodes 125a and 125b spaced from each other by a predetermined distance on each of the active layers 115. A data line 111 is also formed in the first direction.

The first connecting lines 313, which extend from the source electrodes of the pixel regions arranged in the first direction, are also formed.

As a result, driving TFTs D-Tr included in the pixel regions arranged in the first direction and connected with each other through the first connecting lines 313 are formed on the first substrate 100.

Figure 7D:
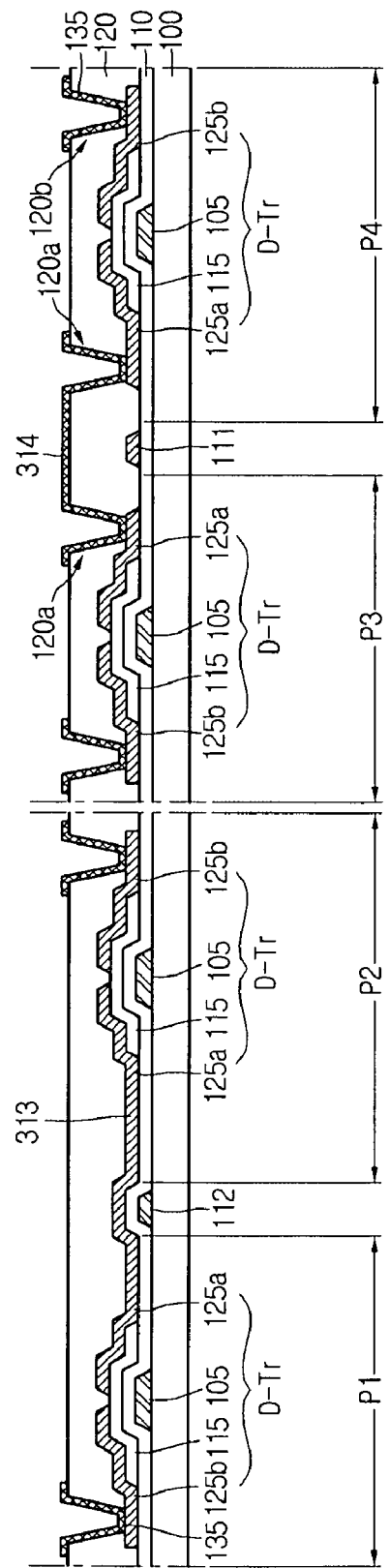

Referring to FIG. 7D, a protective layer 120 is formed on the gate insulating layer 110 including the driving TFTs D-Tr. The protective layer 120 is then patterned to form first and second contact holes 120a and 120b exposing parts of the source and drain electrodes 125a and 125b respectively.

A conductive material is then deposited on the protective layer 120 including the first and second contact holes 120a and 120b and patterned to form a second connecting lines 314 connecting the source electrodes 125a of the driving TFTs D-Tr included in the adjacent pixel regions with each other through the first contact hole 120a. Simultaneously, a contact electrode 135, which is electrically connected with the exposed drain electrodes through the second contact hole 120b, may be formed.

A second substrate having an OLED is then attached to the first substrate to complete the organic electroluminescence display device.

As described above, because an organic electroluminescence display device of the present invention does not include a power line of the related art, an effective area of the pixel region can be increased. Also, as the effective area of the pixel region can be increased, a design area for the TFT is increased, and thus a brightness of the completed organic electroluminescence display device can be increased.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescence display device, comprising:
   a first substrate;
   a plurality of data lines arranged in a first direction on the first substrate;
   a plurality of gate lines arranged in a second direction on the first substrate;
   a plurality of pixel regions defined by the gate lines and the data lines, wherein a first pixel line is defined as a line of the pixel regions arranged in the first direction and a second pixel line is defined as a line of the pixel regions arranged in the second direction;
   a thin film transistor in each pixel region;
   a plurality of first connecting lines electrically connecting electrodes of the thin film transistors on the first pixel lines with each other; and
   a second connecting line electrically connecting electrodes of the thin film transistors on at least one of the second pixel lines with each other,
   wherein the first connecting lines and the second connecting line are commonly connected to the electrodes of the thin film transistors on the at least one of the second pixel lines.

2. The organic electroluminescence display device according to claim 1, wherein the first connecting lines extend from the electrodes of the thin film transistors on the first pixel lines and are integrally formed with the electrodes of the thin film transistors on the first pixel lines.

3. The organic electroluminescence display device according to claim 1, wherein the second connecting line is grounded at one end thereof.

4. The organic electroluminescence display device according to claim 1, wherein the second connecting line is formed of a different material from the first connecting lines.

5. The organic electroluminescence display device according to claim 1, further comprising:
   a second substrate facing the first substrate and having an organic light-emitting diode; and
   a spacer on the second substrate to electrically connect the thin film transistor with the organic light-emitting diode.

6. An organic electroluminescence display device, comprising:
   a first substrate;
   a plurality of data lines arranged in a first direction on the first substrate;
   a plurality of gate lines arranged in a second direction on the first substrate;
   a plurality of pixel regions defined by the gate lines and the data lines, wherein a first pixel line is defined as a line of the pixel regions arranged in the first direction and a second pixel line is defined as a line of the pixel regions arranged in the second direction;
   a thin film transistor in each pixel region;
   a first connecting line electrically connecting electrodes of the thin film transistors on at least one of the first pixel lines with each other; and
   a plurality of second connecting lines electrically connecting electrodes of the thin film transistors on the second pixel lines with each other, wherein the first connecting lines and the second connecting line are commonly connected to the electrodes of the thin film transistors on the at least one of the first pixel lines.

7. The organic electroluminescence display device according to claim 6, wherein the first connecting line extends from the electrodes of the thin film transistors on the at least one of the first pixel lines and is integrally formed with the electrodes of the thin film transistors on the at least one of the first pixel lines.

8. The organic electroluminescence display device according to claim 6, wherein the first connecting line is grounded at one end thereof.

9. The organic electroluminescence display device according to claim 6, wherein the first connecting line is formed of a different material from the second connecting lines.

10. The organic electroluminescence display device according to claim 6, further comprising:
a second substrate facing the first substrate and having an organic light-emitting diode; and
a spacer formed on the second substrate to electrically connect the thin film transistor with the organic light-emitting diode.

11. An organic electroluminescence display device, comprising:
a first substrate;
a plurality of data lines arranged in a first direction on the first substrate;
a plurality of gate lines arranged in a second direction on the first substrate;
a plurality of pixel regions defined by the gate lines and the data lines, wherein a first pixel line is defined as a line of the pixel regions arranged in the first direction and a second pixel line is defined as a line of the pixel regions arranged in the second direction;
a thin film transistor in each pixel region;
a plurality of first connecting lines electrically connecting electrodes of the thin film transistors on the first pixel lines with each other; and
a plurality of second connecting lines electrically connecting electrodes of the thin film transistor on the second pixel lines with each other,
wherein the first connecting lines and the second connecting lines are commonly connected to the electrodes of the thin film transistors on the first pixel lines and the second pixel lines.

12. The organic electroluminescence display device according to claim 11, wherein the first connecting lines extend from the electrodes of the thin film transistors on the first pixel lines and are integrally formed with the electrodes of the thin film transistors on the first pixel lines.

13. The organic electroluminescence display device according to claim 11, wherein at least one kind of lines of the first connecting lines and the second connecting lines are grounded at one end thereof.

14. The organic electroluminescence display device according to claim 11, wherein the first connecting lines are formed of a different material from the second connecting lines.

15. The organic electroluminescence display device according to claim 11, wherein the first connecting lines and the second connecting lines are electrically connected with each other in a mesh shape.

16. The organic electroluminescence display device according to claim 11, further comprising:
a second substrate facing the first substrate and having an organic light-emitting diode; and
a spacer formed on the second substrate to electrically connect the thin film transistor with the organic light-emitting diode.

17. A method of fabricating an organic electroluminescence display device, the method comprising:
preparing a first substrate;
forming a plurality of gate lines and gate electrodes in a second direction on the first substrate;
forming a gate insulating layer on the first substrate including the gate electrodes;
forming an active layer on the gate insulating layer to correspond to the gate electrodes;
forming a plurality of data lines, source/drain electrodes, and a plurality of first connecting lines in a second direction on the active layer, the gate electrodes, the active layer, and the source/drain electrodes constituting thin film transistors, the gate lines and the data lines defining a plurality of pixel regions, wherein a first pixel line is defined as a line of the pixel regions arranged in the first direction and a second pixel line is defined as a line of the pixel regions arranged in the second direction;
forming a protective layer on the thin film transistors; and
forming a second connecting line on the protective layer,
wherein the first connecting lines electrically connect electrodes of the thin film transistors on the first pixel lines with each other, and the second connecting line electrically connects electrodes of the thin film transistors on at least one of the second pixel lines with each other, and
wherein the first connecting lines and the second connecting line are commonly connected to the electrodes of the thin film transistors on the at least one of the second pixel lines.

18. The method according to claim 17, wherein the first connecting lines extend from the electrodes of the thin film transistors on the first pixel lines and are integrally formed with the electrodes of the thin film transistors on the first pixel lines.

19. The method according to claim 17, wherein the second connecting line is grounded at one end thereof.

20. The method according to claim 17, wherein the second connecting line is connected with the electrode of the thin film transistor through a contact hole of the protective layer.

21. A method of fabricating an organic electroluminescence display device, the method comprising:
preparing a first substrate;
forming a plurality of gate lines and gate electrodes having a second direction on the first substrate;
forming a gate insulating layer on the first substrate including the gate electrodes;
forming an active layer on the gate insulating layer to corresponding the gate electrodes;
forming a plurality of data lines, source/drain electrodes, and a first connecting line having a first direction on the active layer, the gate electrodes, the active layer, and the source/drain electrodes constituting thin film transistors, the gate lines and the data lines defining a plurality of pixel regions, wherein a first pixel line is defined as a line of the pixel regions arranged in the first direction and a second pixel line is defined as a line of the pixel regions arranged in the second direction;
forming a protective layer on the thin film transistors; and
forming a plurality of second connecting lines on the protective layer,
wherein the first connecting line electrically connects electrodes of the thin film transistors on at least one of the first pixel lines with each other, and the second connecting lines electrically connect electrodes of the thin film transistors on the second pixel lines with each other, and wherein the first connecting lines and the second connecting line are commonly connected to the electrodes of the thin film transistors on the at least one of the first pixel lines.

22. The method according to claim 21, wherein the first connecting line extends from the electrodes of the thin film transistors on the at least one of the first pixel lines and is integrally formed with the electrodes of the thin film transistors on the at least one of the first pixel lines.

23. The method according to claim 21, wherein the first connecting line is grounded at one end thereof.

24. The method according to claim 21, wherein the second connecting line is connected with the electrode of the thin film transistor through a contact hole of the protective layer.

25. A method of fabricating an organic electroluminescence display device, the method comprising:

preparing a first substrate;

forming a plurality of gate lines and gate electrodes having a second direction on the first substrate;

forming a gate insulating layer on the first substrate including the gate electrodes;

forming an active layer on the gate insulating layer to corresponding the gate electrodes;

forming a plurality of data lines, source/drain electrodes, and a plurality of first connecting lines having a first direction on the active layer, the gate electrodes, the active layer, and the source/drain electrodes constituting thin film transistors, the gate lines and the data lines defining a plurality of pixel regions, wherein a first pixel line is defined as a line of the pixel regions arranged in the first direction and a second pixel line is defined as a line of the pixel regions arranged in the second direction;

forming a protective layer on the thin film transistors; and forming a plurality of second connecting lines on the protective layer, wherein the first connecting lines electrically connect electrodes of the thin film transistors on the first pixel lines with each other, and the second connecting lines electrically connect electrodes of the thin film transistors on the second pixel lines with each other, and wherein the first connecting lines and the second connecting lines are commonly connected to the electrodes of the thin film transistors on the first pixel lines and the second pixel lines.

26. The method according to claim 25, wherein the first connecting lines extend from the electrodes of the thin film transistors on the first pixel lines and are integrally formed with the electrodes of the thin film transistors on the first pixel lines.

27. The method according to claim 25, wherein at least one kind of lines of the first connecting lines and the second connecting lines are grounded at one end thereof.

28. The method according to claim 25, wherein the second connecting lines are connected with the electrodes of the thin film transistor through a contact hole of the protective layer.

29. The organic electroluminescence display device according to claim 5, further comprising:

a contact electrode between the spacer and the thin film transistor, wherein the second connecting line is formed of the same material as the contact layer.

30. The organic electroluminescence display device according to claim 10, further comprising:

a contact electrode between the spacer and the thin film transistor, wherein the second connecting lines are formed of the same material as the contact layer.

31. The organic electroluminescence display device according to claim 16, further comprising:

a contact electrode between the spacer and the thin film transistor, wherein the second connecting lines are formed of the same material as the contact layer.

32. The method according to claim 17, further comprising:

forming a contact layer on the protective layer, wherein the second connecting line is formed of the same material as the contact layer.

33. The method according to claim 21, further comprising:

forming a contact layer on the protective layer, wherein the second connecting lines are formed of the same material as the contact layer.

34. The method according to claim 25, further comprising:

forming a contact layer on the protective layer, wherein the second connecting lines are formed of the same material as the contact layer.

* * * * *